United States Patent
Ichikawa

[19]

[11] Patent Number: 6,130,851
[45] Date of Patent: Oct. 10, 2000

[54] SEMICONDUCTOR MEMORY HAVING A REDUNDANCY FUSE BROKEN BY AN ELECTRIC CURRENT

[75] Inventor: Takeshi Ichikawa, Tokyo, Japan

[73] Assignee: Oki Electric Industry Co., Ltd., Tokyo, Japan

[21] Appl. No.: 09/449,471

[22] Filed: Nov. 29, 1999

[30] Foreign Application Priority Data

Dec. 3, 1998 [JP] Japan .................................. 10-343966

[51] Int. Cl.[7] ..................................................... G11C 7/00
[52] U.S. Cl. ...................... 365/225.7; 365/200; 365/201; 365/230.02; 365/230.08; 365/189.02; 365/189.09
[58] Field of Search ................................ 365/96, 189.02, 365/230.02, 200, 201, 225.7, 230.08, 189.09

[56] References Cited

U.S. PATENT DOCUMENTS

| 5,661,323 | 8/1997 | Choi et al. | 257/378 |
| 5,844,296 | 12/1998 | Murray et al. | 257/529 |
| 5,929,691 | 7/1999 | Kim et al. | 327/525 |

FOREIGN PATENT DOCUMENTS

| 4-014700 | 1/1992 | Japan | G11C 29/00 |
| 5-074190 | 3/1993 | Japan | G11C 29/00 |
| 6-195995 | 7/1994 | Japan | G11C 29/00 |
| 7-169293 | 7/1995 | Japan | G11C 29/00 |

*Primary Examiner*—Andrew Q. Tran
*Attorney, Agent, or Firm*—Jones Volentine, LLC

[57] ABSTRACT

An object of the present invention is to provide a semiconductor memory device capable of shortening the time required to complete all the tests without shifting a sample between processes for first and second probing tests. The semiconductor memory device according to the present invention comprises a redundant fuse provided between a source potential and a ground potential and composed of a material cut by the flow of a high current therethrough, a detector circuit which is electrically connected to a node provided on one electrode side of the redundant fuse and outputs a signal in response to a potential applied to the node, a selector circuit for selectively transferring input data to either of a normally-used memory cell and a redundant memory cell, a control circuit for controlling an electrical connection between the source potential and the redundant fuse, and voltage applying pads electrically connected to both ends of the redundant fuse.

21 Claims, 6 Drawing Sheets

SEMICONDUCTOR MEMORY HAVING A REDUNDANCY FUSE BROKEN BY AN ELECTRIC CURRENT

BACKGROUND OF THE INVENTION

This invention relates to a semiconductor memory device having a redundant fuse circuit, and particularly to a redundant fuse circuit having a fuse broken by an electric current, capable of contributing to a yield-enhancement of a dynamic random access memory (hereinafter called "DRAM").

Since a conventional DRAM is hard to obtain a chip operated on an all-bit basis, an operated memory bit (memory cell) has been confirmed once by a memory tester (hereinafter called "first probing test"). Thereafter, a decision (hereinafter called "redundant retrieval") as to whether a failure-detected bit can be replaced by a prepared redundant bit (hereinafter called "redundant bit"), is made When it is found that the failure-detected bit can be replaced by the prepared redundant bit, data (hereinafter called "redundant data") for its replacement is outputted. A prepared fuse (hereinafter called "redundant fuse"), which allows the logical replacement of the defective bit with the redundant bit by its cutting, is cut (hereinafter fused-cut) by a laser repair device based on the redundant data. Thus, the defective bit is replaced with the redundant bit and a test (hereinafter called "second probing test") to determine whether the replaced chip is good or not is performed again by the memory tester, whereby a DRAM determined as a good product is obtained.

As Japanese Patent Publications each disclosing such a redundant fuse, may be mentioned Japanese Patent Application Laid-Open Nos. Hei 4-14700, 5-74190, 6-195995, 7-169293, etc.

Since, however, the first and second probing tests employed in the conventional DRAM make use of the memory tester and the fuse cut is performed using a device different from the laser repair device, the sample must be shifted in the respective processes for the tests, so that much time was required till the completion of all the tests.

SUMMARY OF THE INVENTION

With the foregoing in view, it is therefore an object of the present invention to provide a semiconductor memory device capable of shortening a test time interval without performing a fuse cut by a laser repair device or the like.

According to one aspect of the invention, for achieving the above object, there is provided a semiconductor memory device, comprising:

a redundant fuse provided between a source potential and a ground potential and composed of a material cut by causing a high current flow therein;

a detector circuit electrically connected to a node provided on one electrode side of the redundant fuse and for outputting a signal in response to a potential applied to the node;

a selector circuit for selectively transferring input data to either of a normally-used memory cell and a redundant memory cell in response to the signal outputted from the detector circuit;

a control circuit for controlling an electrical connection between the source potential and the redundant fuse; and voltage applying pads electrically connected to both ends of the redundant fuse.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRITION OF THE PREFERRED EMBODIMENTS

Preferred embodiments of the present invention will hereinafter be described with reference to the accompanying drawings. Incidentally, the sizes, forms and layouts of respective components in the drawings are merely diagrammatically illustrated to such an extent as to allow the understanding of the present invention. It should be understood that numerical conditions to be described below are mere illustrations.

Figure 1:
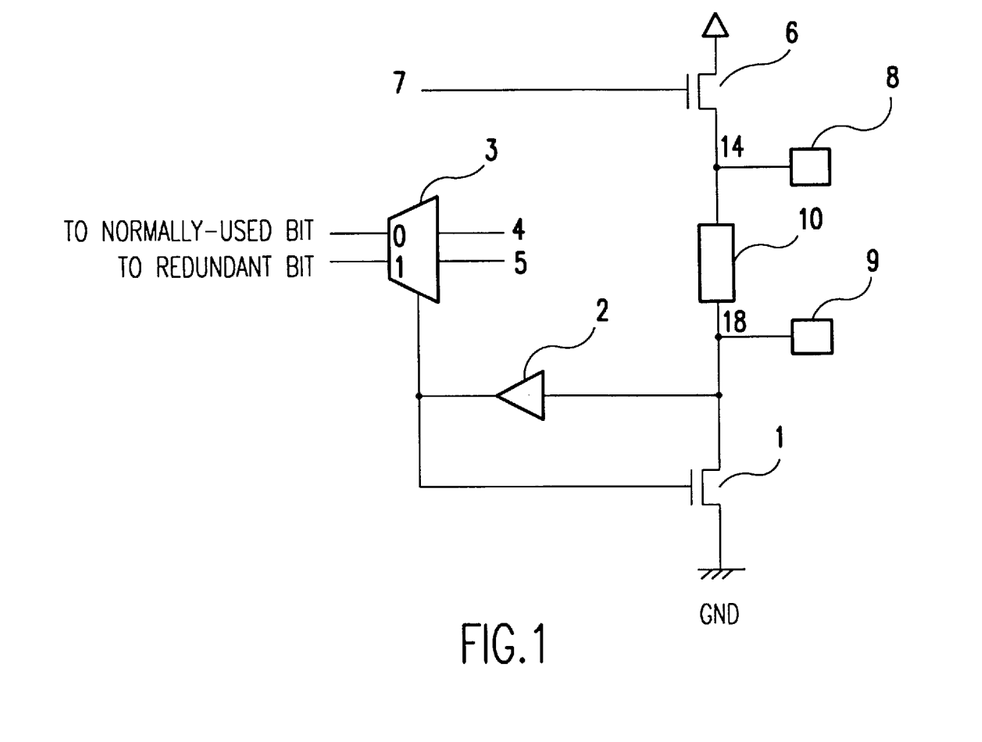
FIG. 1 is a diagram showing a redundant fuse circuit according to a first embodiment of the present invention.

FIG. 1 is a diagram showing a first embodiment of the present invention.

The other electrode of an NMOS transistor 1 having one electrode electrically connected to a ground potential GND is electrically connected to the input of an inverter circuit 2. Further, the gate of the NMOS transistor 1 is electrically connected to the output of the inverter circuit 2. The inverter circuit 2 functions as a detector circuit or detecting circuit for detecting the potential of a node provided on the ground potential side of a redundant fuse. The output of the inverter circuit 2 is electrically connected to a selector circuit 3.

When an output produced from the inverter circuit 2 is "0 (ground GND level)", the selector circuit 3 sends out a data signal 4 and an address signal 5 inputted thereto for the purpose of an access to a commonly-used bit (an output 0 shown in the drawing is selected). On the other hand, when the output of the inverter circuit 2 is "1 (source or power supply Vcc level), the selector circuit 3 sends out the input data signal 4 and address signal 5 for the purpose of an access to a redundant bit (an output 1 shown in the drawing is selected).

One terminals of a GND pad 9 and the redundant fuse 10 are electrically connected to the other electrode of the NMOS transistor 1. The other terminal of the redundant fuse 10 is electrically connected to a high voltage pad 8 and a control circuit 6 comprised of an NMOS transistor. The control circuit 6 is electrically connected to the power supply Vcc and is controlled by a redundancy cut enable signal 7.

When the redundancy cut enable signal 7 is "0", the control circuit electrically disconnects between the power supply and the redundant fuse 10. On the other hand, when the redundancy cut enable signal 7 is "1", the control circuit 6 electrically connects between the power supply and the redundant fuse 10. Incidentally, the redundant fuse 10 is composed of a material such as aluminum or the like cut or opened up by feeding a high current therethrough.

Figure 2:
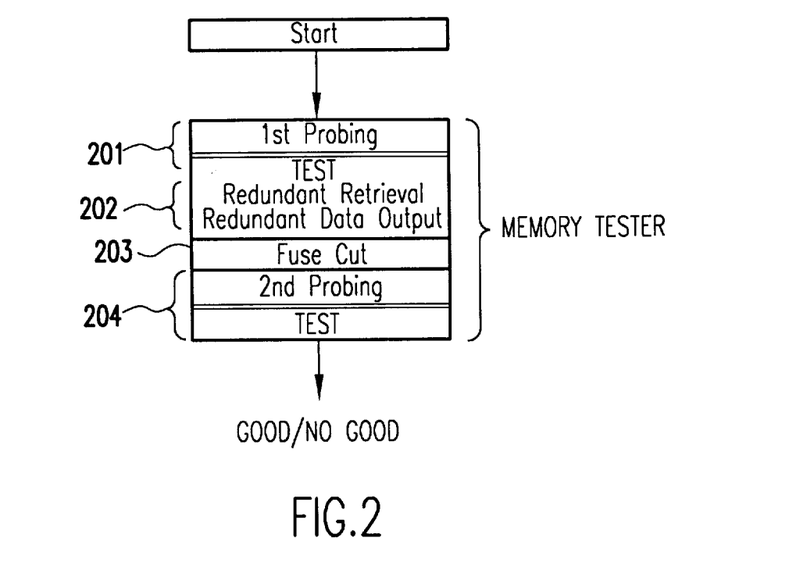
FIG. 2 is a test flowchart of the first embodiment.

A test process using the redundant fuse circuit showing the first embodiment will next be explained. FIG. 2 is a test flowchart for describing a test process for a semiconductor memory device having the redundant fuse circuit showing the first embodiment.

A redundancy cut enable signal7 is first set to "0". Thereafter, a high voltage pad 8 and a GND pad 9 connected to a redundant fuse 10 to be cut or blown are selected based on redundant data outputted in a first probing test 201 (redundant retrieval and redundant data output 202). A voltage is applied between these selected high voltage pad 8 and GND pad 9 to feed a current through the redundant fuse 10, thereby cutting or opening up the redundant fuse 10 (fuse cut 203). It is determined from the fuse cut in a second probing test 204 whether or not a chip in which a defective bit is replaced by a redundant bit is good. A series of these operations are all performed by a memory tester.

According to the first embodiment, as has been described above, a redundant fuse 1 composed of polysilicon is replaced by the redundant fuse 10 composed of the material (e.g., aluminum) cut due to the feeding of the high current therethrough as in each redundant fuse employed in a DRAM. There are also provided the pads (high voltage pad 8 and GND pad 9) for allowing the current to flow through the redundant fuse 10, the control circuit 6 for electrically disconnecting between the redundant fuse and the power supply, and the redundancy cut enable signal 7 for controlling the control circuit 6.

Owing to the above-described construction, the series of operations such as the first probing test 201, redundant retrieval and redundant data output 202, fuse cut 203 and second probing test 204 can be performed by the memory tester alone. Thus, since labor and time necessary for the transfer of a sample, the setting of a device, etc. can be saved upon execution of each individual test processes, a test time interval can be shortened.

Figure 3:
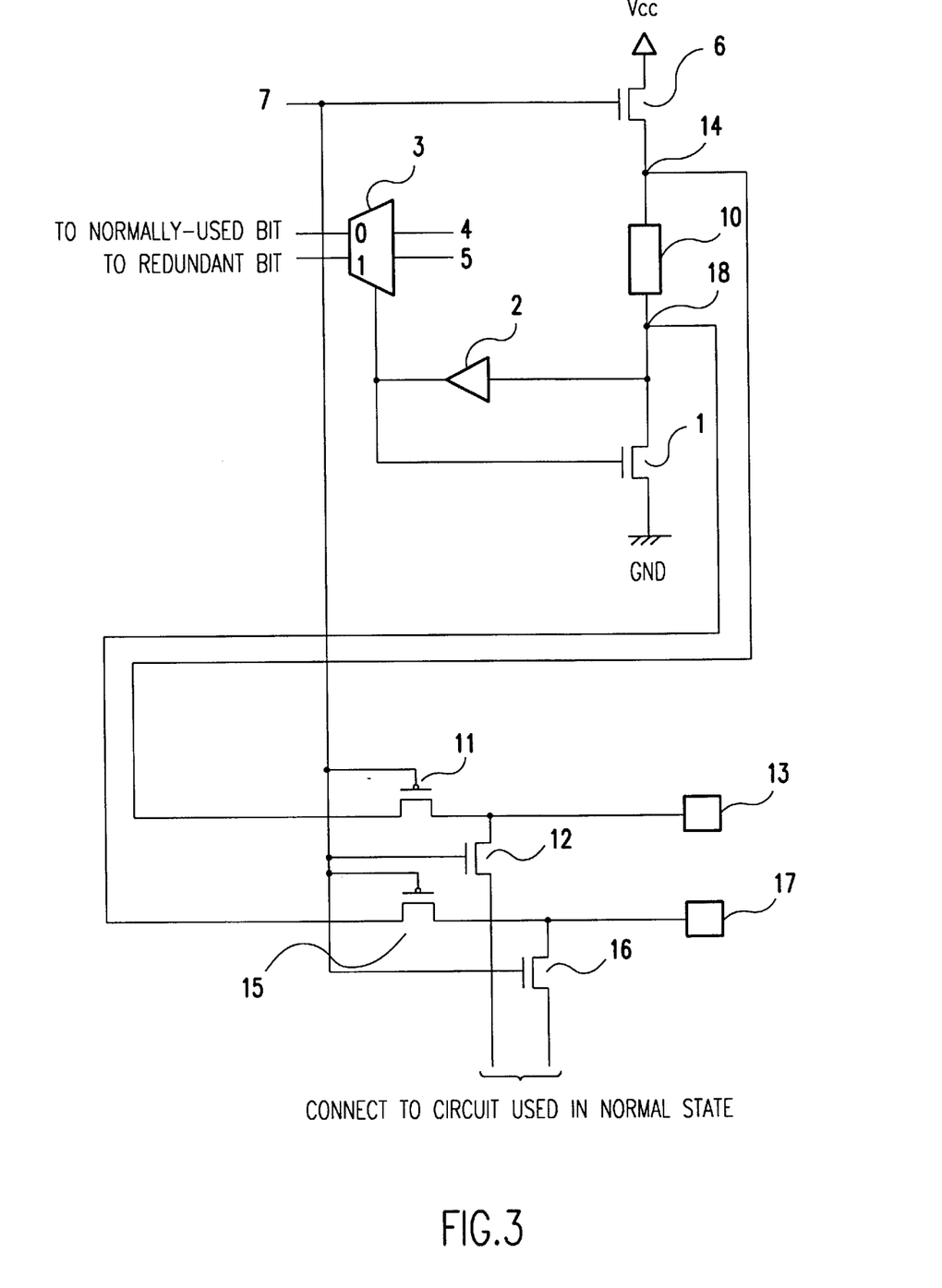
FIG. 3 is a diagram illustrating a redundant fuse circuit according to a second embodiment of the present invention.

FIG. 3 is a diagram showing a redundant fuse circuit according to a second embodiment of the present invention. In FIG. 3, the same elements of structure as those employed in the first embodiment are identified by the same reference numerals and their description will therefore be omitted. Thus, only elements of structure added to the present redundant fuse circuit will be explained below.

In the redundant fuse circuit according to the second embodiment, a control circuit 11 comprised of a PMOS transistor is electrically connected to a connecting point 14 provided between a control circuit 6 and a redundant fuse 10. The control circuit 11 is controlled by a redundancy cut enable signal 7 and provided between the already-existing pad 13 and the connecting point 14. In the redundant fuse circuit according to the second embodiment as well, a control circuit 15 composed of a PMOS transistor is electrically connected to a connecting point 18 provided between the redundant fuse 10 and a transistor 1. The control circuit 15 is controlled by the redundancy cut enable signal 7 and provided between the already-existing pad 17 and the connecting point 18.

Further, the redundant fuse circuit according to the second embodiment is controlled by the redundancy cut enable signal 7 and has control circuits 12 and 16 respectively composed of NMOS transistors. The control circuit 12 is provided between the already-existing pad 13 and an unillustrated circuit used in its normal state. The control circuit 16 is provided between the already-existing pad 17 and the unillustrated circuit used in its normal state.

These control circuits 11, 12, 15 and 16 function as a connecting control circuit for selectively connecting the already-existing pads 13 and 17 to the circuit used in the normal state or the connecting points 14 and 18.

The operation of the redundant fuse circuit according to the second embodiment will next be described.

The basic operation of the redundant fuse circuit is as follows: when the redundancy cut enable signal 7 is "0", the control circuits 11 and 15 electrically connect the already-existing pads 13 and 17 and the connecting points 14 and 18 respectively, and the control circuits 12 and 16 electrically disconnect the already-existing pads 13 and 17 from the circuit used in the normal state.

On the other hand, when the redundancy cut enable signal 7 is "1", the control circuits 12 and 16 electrically connect the already-existing pads 13 and 17 and the circuit used in the normal state, and the control circuits 11 and 15 electrically disconnect the already-exiting pads 13 and 17 from the connecting points 14 and 18 respectively.

A process for testing the redundant fuse circuit according to the second embodiment will be explained.

The redundancy cut enable signal 7 is first set to "0". Thereafter, a voltage is applied between the already-existing pads 13 and 17 electrically connected to their corresponding connecting points 14 and 18 of a redundant fuse 10 to be cut, based on redundant data outputted in a first probing test to feed a current through the redundant fuse 10, thereby cutting or opening up the redundant fuse 10. It is determined from the fuse cut in a second probing test whether or not a chip in which a defective bit is replaced by a redundant bit, is good. A series of these operations are all performed by a memory tester.

According to the second embodiment, as has been described above, the control circuits 11, 12, 15 and 16 are added to the configuration of the first embodiment and the already-existing pads 13 and 17 are used as an alternative to the high voltage pad 8 and the GND pad 9.

Since it is unnecessary to make a change in pad configuration owing to the above-described construction, a jig used between the memory tester and the sample can make use of the already-existing one. Further, since the pads are much greater than the control circuits in area respectively, a higher integrable chip can be provided which eliminates for the need of spaces for providing the high voltage pad 8 and the GND pad 9. Incidentally, a test time interval can be shortened even in the case of this chip in a manner similar to the first embodiment.

Figure 4:
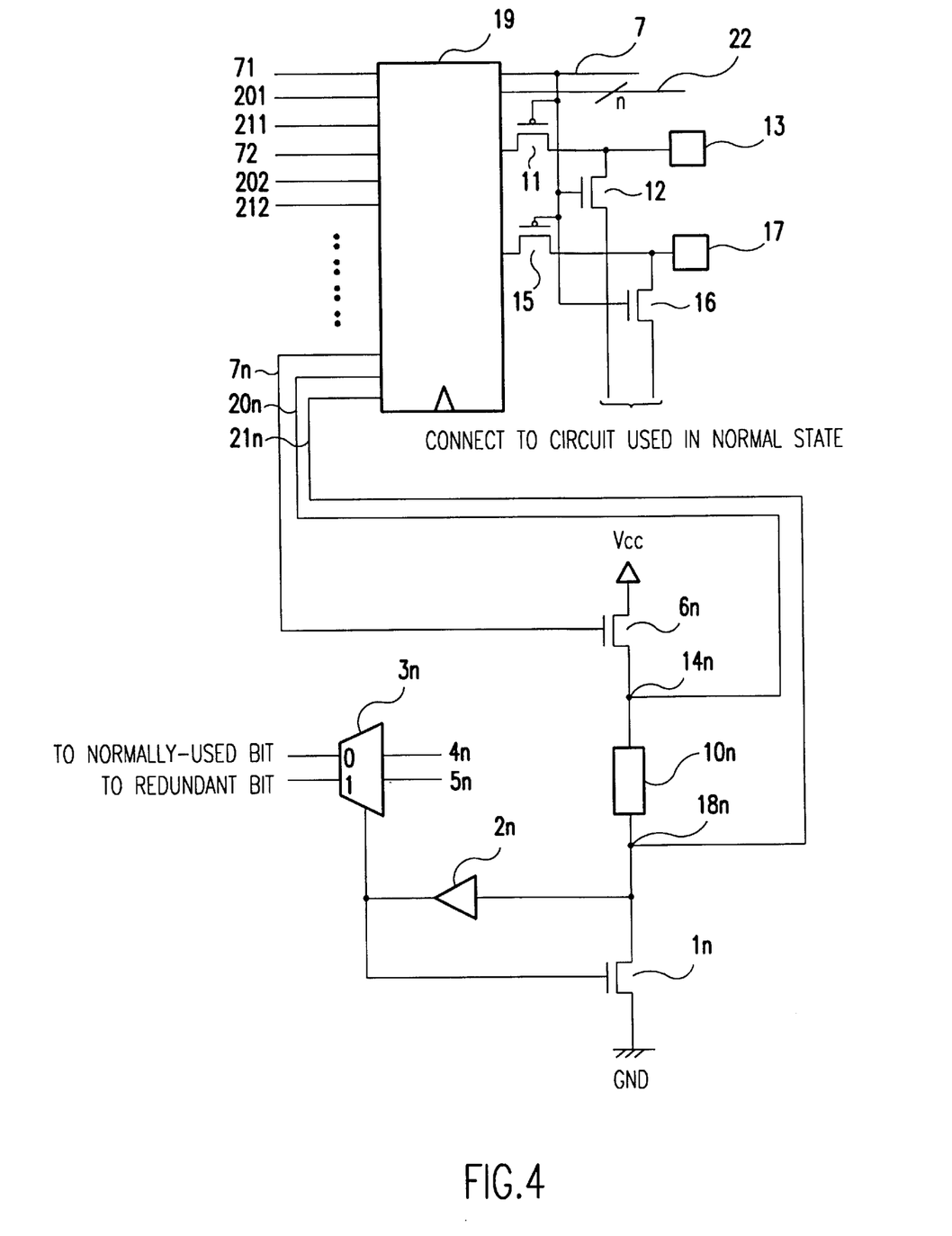
FIG. 4 is a diagram depicting a redundant fuse circuit according to a third embodiment of the present invention.

FIG. 4 is a diagram showing a redundant fuse circuit according to a third embodiment of the present invention. In FIG. 4, the same elements of structure as those employed in the second embodiment are identified by the same reference numerals and their description will be omitted. Only added components will be explained below. Incidentally, n is defined as an integer greater than or equal to 1 in the third embodiment.

A control circuit 19 is electrically connected to the already-existing pads 13 and 17 through control circuits 11 and 15 respectively. The control circuit 19 receives a redundancy cut enable signal 7 and a redundant data signal 22 therein and outputs redundancy cut enable signals 7l through 7n, high voltage signals 20l through 20n and GND signals 21l through 21n therefrom. Since a plurality of redundant circuits supplied with the output signals from the control circuit 19 are identical to the circuit shown in FIG. 3 in configuration, only a typical one will be illustrated and described. Namely, a control circuit 6n, connecting points 14n and 8n, a redundant fuse 10n, an inverter circuit 2n, a selector circuit 3n, a transistor 1n, an address signal 4n, and an address signal 5n are identical to the control circuit 6, the connecting points 14 and 18, the redundant fuse 10, the inverter circuit 2, the selector circuit 3, the transistor 1, the address signal 4, and the address signal 5 described in the second embodiment.

Incidentally, the redundant data signal 22 is a signal for inputting redundant data composed of an n bit. The redundant data signal 22 serves so as to transfer information about which redundant fuse (redundant fuses 10l through 10n) should be cut, to the control circuit 19.

Figure 5:
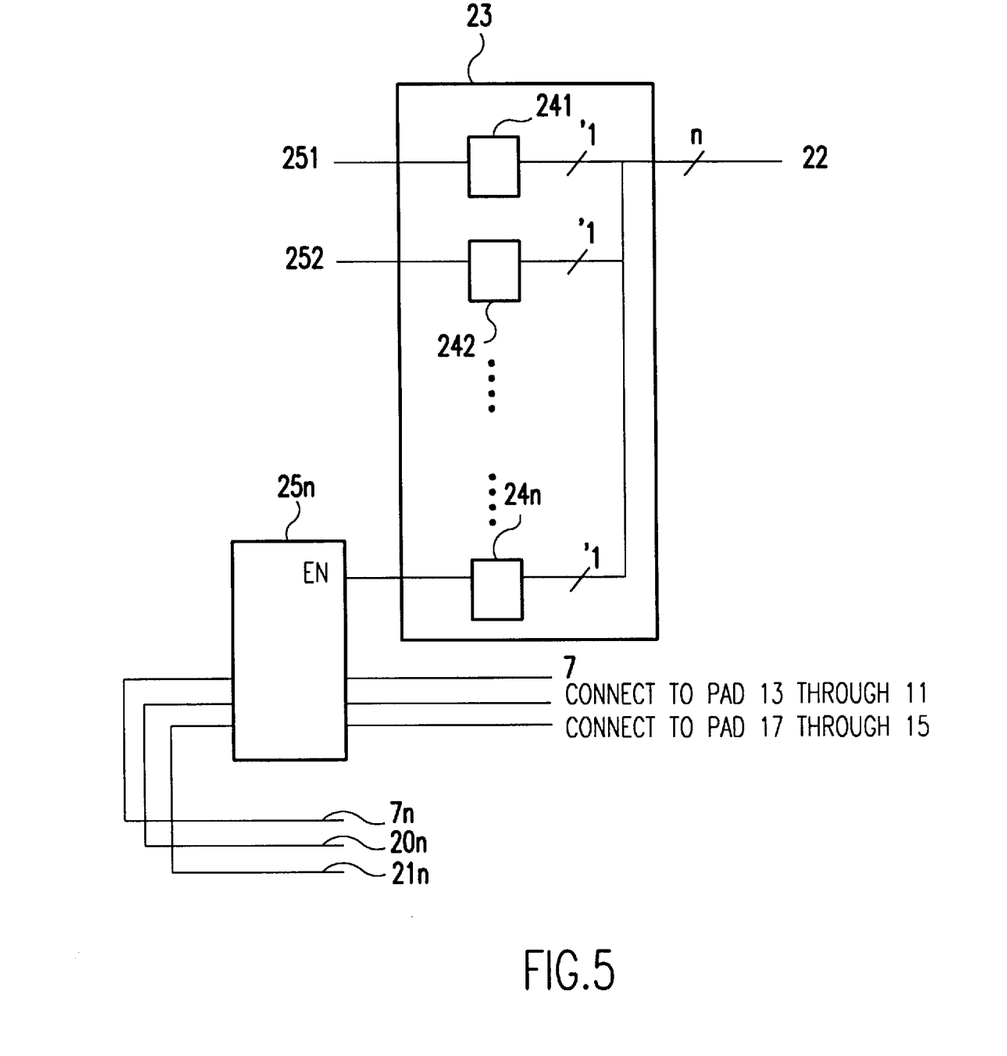
FIG. 5 is a block diagram showing a control circuit employed in the third embodiment.

FIG. 5 is a block diagram showing the inside of the control circuit 19. The control circuit 19 will be explained below with reference to FIG. 5.

The control circuit 19 has a control circuit 23 and a plurality of control circuits 25l through 25n thereinside. The control circuit 23 has a plurality of registers Reg24l through 24n. Each of the registers Reg24l through 24n is constructed so as to receive a redundant data signal one bit by one bit. The outputs of the registers Reg24l through 24n are respectively electrically connected to enable inputs EN of the control circuits 25l through 25n. Each of the control circuits 25l through 25n has three inputs: a first input supplied with a redundancy cut enable signal 7 and other two inputs being electrically connected to the already-existing pads 13 and 17 through the control circuits 11 and 15 respectively.

The operation of the third embodiment will next be explained.

When the control circuit 19 receives the redundant data signal 22 therein, the redundant data signal is transferred to the control circuit 23. When the control circuit 23 receives n-bit data about the redundant data signal 22 therein, it decomposes the data into redundant data signals every bits and send them to their corresponding registers Reg24l through 24n. These redundant data signals decomposed every individual bits are respectively held in the registers Reg24l through 24n and outputted to the control circuits 25l through 25n. The respective control circuits 25l through 25n receives therein the signals outputted from the registers Reg24l through 24n, the signals inputted thereto from the already-existing pads 13 and 17 and the redundancy cut enable signal 7. When the output signals of the registers Reg24l through 24n are all "1", the control circuits 25l through 25n output the input redundancy cut enable signal therefrom as the redundancy cut enable signals 7l through 7n, output the signal inputted via the control circuit 11 therefrom as the high voltage signals 20l through 20n, and output the signal inputted from the already-existing pad 17 electrically connected via the control circuit 15 therefrom as the QND signals 21l through 21n. On the other hand, when the output signals of the registers Reg24l through 24n are all "0", the redundancy cut enable signals 7l through 7n are set to "1" and the high voltage signals 20l through 20n and GND signals 21l through 21n are respectively brought to high impedance states. Thus, the control circuit 19 functions as a selection control circuit for selecting a predetermined redundant circuit.

When the redundancy cut enable signal 7 is now "0", the control circuit 25m corresponding to the register Reg24m (1_m_n: m exist in plural form) inputted with "1" according to the redundant data signal 22 outputs the redundancy cut enable signal 7 therefrom as the redundancy cut enable signal 7m, outputs the signal inputted from the already-existing pad 13 electrically connected via the control circuit 11 therefrom as the high voltage signal 20m, and outputs the signal inputted from the already-existing pad 17 electrically collected via the control circuit 15 therefrom as the GND signal 21m. When a predetermined voltage is applied between the already-existing pad 13 and the already-existing pad 17 after the completion of these crossings, a current flows through the redundant fuse 10m electrically connected to the control circuit 25m so that the redundant fuse 10m is cut off.

According to the third embodiment, as has been described above, the configuration of the second embodiment is provided with the control circuit 19 which outputs the redundancy cut enable signals 7l through 7n in response to the redundant data signal 22 and the redundancy cut enable signal 7 and output the signals inputted from the already-existing pads 13 and 17 electrically connected thereto via the control circuits 11 and 15 therefrom as the high voltage signals 20l through 20n and the GND signals 21l through 21n respectively.

In the second embodiment, the two already-existing pads are used for each redundant fuse 10 to cut off the redundant fuse 10 and the fuse configuration (the number of fuses) is limited by the number of pads. Since, however, a plurality of fuses can be cut for the already-exiting two pads in the third embodiment, no limitation is imposed on the number of pads, whereby the configuration of each redundant fuse (the number of redundant fuses) can be freely set.

Figure 6:
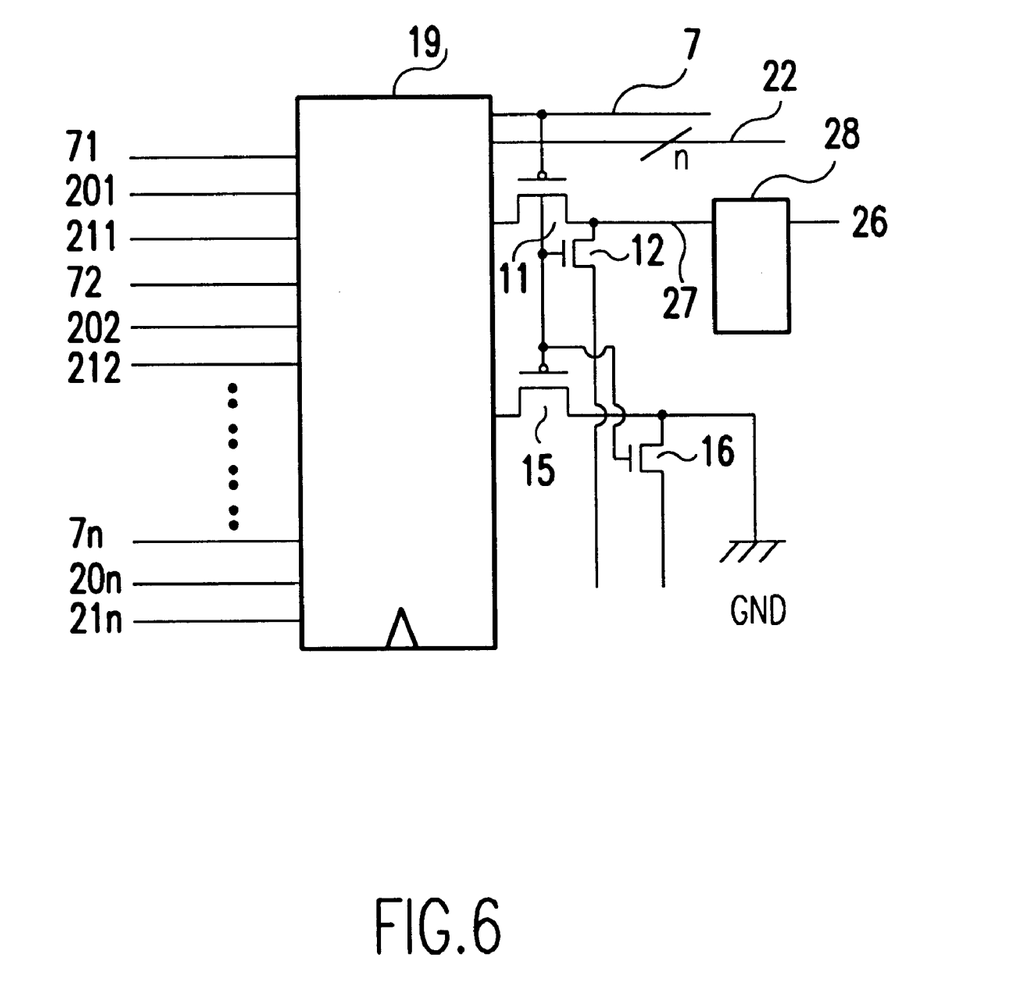
FIG. 6 is a block diagram illustrating a fourth embodiment of the present invention.

FIG. 6 is a block diagram showing a fourth embodiment. In FIG. 6, the same elements of structure as those employed in the third embodiment are identified by the same reference numerals and their description will be omitted. Only added components will be explained below. While the control circuit 6n, connecting points 14n and 8n, redundant fuse 10n, inverter circuit 2n, selector circuit 3n, transistor 1n, address signal 4n and address signal 5n shown in FIG. 4 are omitted in the fourth embodiment, these components exist as a redundant circuit for receiving redundancy cut enable signal 7l through 7n, high voltage signals 20l through 20n and GND signals 21l through 21n therein in a manner similar to FIG. 4.

A high voltage generator 28 outputs a high voltage output signal 27 therefrom when a pulse input signal 26 is inputted thereto. The high voltage output signal 27 is inputted to a control circuit 11. Namely, the control circuit 11 is not electrically connected to the already-existing pad 13 as in the third embodiment but to the high voltage generator 28. Further, a control circuit 15 is electrically connected to a ground potential GND as an alternative to the connection to the already-existing pad 17 employed in the third embodiment.

Figure 7:
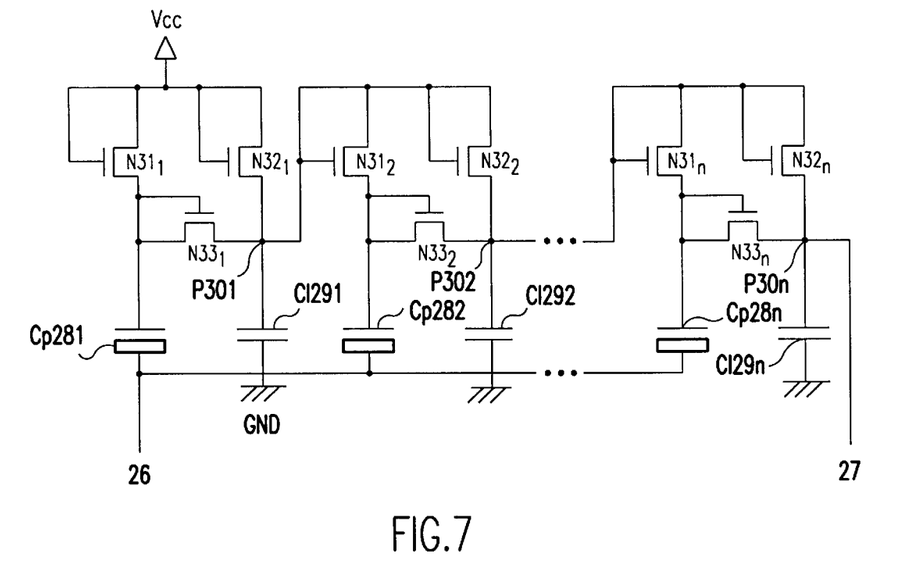
FIG. 7 is a circuit diagram depicting a high voltage generator employed in the fourth embodiment.
Figure 8:
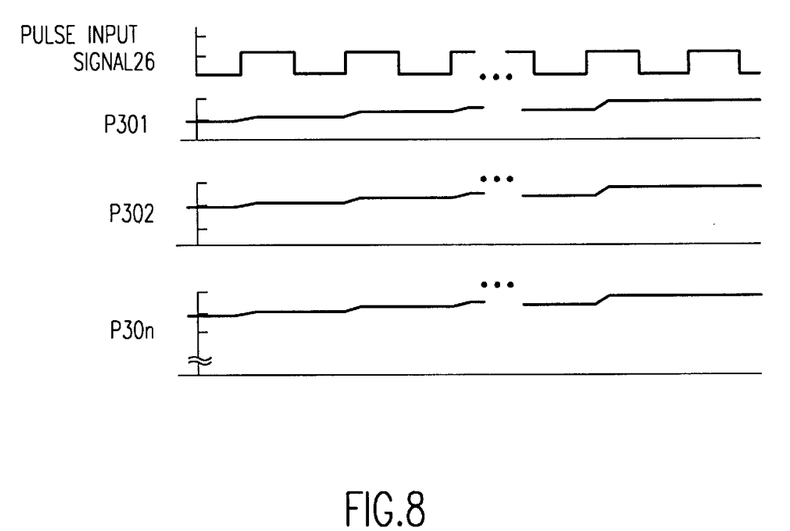
FIG. 8 is a diagram for describing the operation of the high voltage generator.

FIG. 7 is a circuit diagram showing the high voltage generator 28, and FIG. 8 is a timing chart for explaining the operation of the high voltage generator 28, respectively. A circuit configuration of the high voltage generator 28 and the operation thereof will be explained with reference to these drawings.

The high voltage generator 28 comprises a plurality of NMOS transistor N31*l*, N32*l*, N33*l*, . . . N31*n*, N32*n* and N33*n*, and a plurality of capacitors Cp28*l*, CI29*l*, . . . Cp28*n*, and CI29*n*. These three NMOS transistors and two capacitors constitute a boosting circuit consisting of one stage, and the high voltage generator 28 is made up of a plurality of stages of boosting circuits 70*l*, . . . 70*n*.

Described specifically, the boosting circuit 70*l* corresponding to the first stage comprises the NMOS transistors N31*l*, N32*l* and N33*l* and the capacitors Cp28*l* and CI29*l*. The gates and first electrodes of the NMOS transistors N31*l* and N32*l* are electrically connected to a power supply potential or source potential Vcc. A second electrode of the NMOS transistor N31*l* is electrically connected to the gate and first electrode of the NMOS transistor N33*l*. A second electrode of the NMOS transistor N32*l* is electrically connected to a second electrode of the NMOS transistor N33*l* and a node P30*l*. A first electrode of the capacitor Cp28*l* is electrically connected to the first electrode of the NMOS transistor N33*l* and a second electrode thereof is supplied with the pulse input signal 26. A first electrode of the capacitor CI29*l* is electrically connected to the node P30*l* and a second electrode thereof is electrically connected to the ground potential GND. In the first-stage boosting circuit 70*l*, a potential obtained by boosting the source potential Vcc used as a reference potential appears at the output node P30*l*.

The boosting circuits 702 . . . 70*n* corresponding to the second stage and later are identical in circuit configuration to the first-stage boosting circuit 70*l*. Since, however, the potential (corresponding to the potential at the output node P30*l* in the second stage) boosted in the preceding stage is boosted as the reference potential, the gates and first electrodes of the NMOS transistors N31*n* and N32*n* are electrically connected to an output node P30(n−1) of the preceding stage.

When the pulse input signal 26 is inputted to the high voltage generator 28 as shown in FIG. 8, an electrical charge charged into the capacitor Cp28*l* moves to the capacitor CI29*l* so that a voltage greater than the source potential is obtained at a nodal point corresponding to the output node P30*l*. Further, when the voltage at the output node P30*l* is used to charge the capacitor Cp282, a voltage higher than that at the output node P30*l* is obtained at an output node P302. An output obtained by repeating this operation n times (where n is an integer greater than or equal to 1 and indicates a number repeated until a desired voltage is obtained) is obtained at an output node P30*n*. This results in the high voltage output signal 27.

A test operation to be executed in the fourth embodiment will be explained. The pulse input signal 26 is inputted to the high voltage generator 28 while a first probing test is being performed. After the first probing test has been completed and the redundant data has been outputted, the redundancy cut enable signals 7*l* through 7*n* are all set to "0". Thereafter, when the redundant data outputted as the redundant data signal 22 is inputted and the redundant data enable signal 7 is set to "0", a high voltage applied to the high voltage output signal 27 corresponding to the output of the high voltage generator 28 is inputted to the control circuit 19 through the control circuit 11. In other words, the high voltage results in a state being applied between the high voltage output signal 27 and GND as an alternative to the application of the voltage between the already-existing pads 13 and 17 in the third embodiment. Thus, the corresponding redundant fuse 10*m* selected by the redundant data is cut.

According to the fourth embodiment, since a redundant fuse can be cut without applying an excessive voltage to a sample from a memory tester, the load on the memory tester can be lightened so that a stable test can be performed.

While the embodiments mentioned above have been described by the examples applied to DRAMs respectively, the present invention is applicable even to an IC which is capable of relieving the redundancy and makes use of a redundancy-relieving device other than a device for measuring an IC upon execution of the redundant relief.

According to the present invention, as has been described above in detail, a semiconductor memory device can be provided which is capable of detecting the presence or absence of shorts in word and bit lines without writing data into each memory cell.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device, comprising:
   a first pad for receiving a first potential voltage from outside of said device and supplying the first potential voltage;
   a second pad for receiving a second potential voltage from outside of said device and supplying the second potential voltage;
   a redundant fuse having a first terminal connected to the first pad and a second terminal connected to the second pad, said redundant fuse being made of a material broken by an electric current flowing therethrough when the first and second potential voltage are applied to said first and second pads;
   a detector circuit connected to one of the first and second terminals of said redundant fuse for outputting a detecting signal in response to a potential applied thereto from the one of the first and second terminals of said redundant fuse;
   a selector circuit for selectively transferring input data to either a normally-used memory cell or a redundant memory cell in response to the detecting signal; and
   a control circuit for supplying a third potential voltage to the other of first and second terminals of said redundant fuse in response to a redundancy cut enable signal.

2. A semiconductor memory device according to claim 1, wherein the second, third and first potential voltage are ground potential voltage, a power supply voltage and a high voltage being higher than the power supply voltage, respectively.

3. A semiconductor memory device according to claim 1, wherein said control circuit has a transistor including a first terminal connected to a third potential voltage source, a second terminal connected to the other of first and second terminals of said redundant fuse, and a control terminal coupled to receive the redundancy cut enable signal.

4. A semiconductor memory device according to claim 1, wherein said detector circuit has an inverter including an input terminal connected to the one of the first and second terminals of said redundant fuse and an output terminal outputting the detecting signal, and an transistor including a first terminal connected to the input terminal of the inverter, a second terminal connected to a second potential voltage source and a control terminal connected to the output terminal of the inverter.

5. A semiconductor memory device according to claim 1, further comprising a connection control circuit connected between the first and second pads, and the first and second terminals of said redundant fuse, said connection control circuit connecting the first and second pads to either the first and second terminals of said redundant fuse or a circuit used in a normal state in response to the redundancy cut enable signal.

6. A semiconductor memory device according to claim 5, wherein said connection control circuit has     a first transistor including a first terminal connected to the first pad, a second terminal connected to the circuit used in the normal state, and a control terminal coupled to receive the redundancy cut enable signal,     a second transistor including a first terminal connected to the second pad, a second terminal connected to the circuit used in the normal state, and a control terminal coupled to receive the redundancy cut enable signal,     a third transistor including a first terminal connected to the first pad, a second terminal connected to the first terminal of said redundant fuse, and a control terminal coupled to receive the redundancy cut enable signal,     a fourth transistor including a first terminal connected to the second pad, a second terminal connected to the second terminal of said redundant fuse, and a control terminal coupled to receive the redundancy cut enable signal.

7. A semiconductor memory device according to claim 6, wherein said first and second transistors have a first conductivity type and wherein said third and fourth transistors have a second conductivity type.

8. A semiconductor memory device, comprising:

a first pad for receiving a first potential voltage from outside of said device and supplying the first potential voltage;

a second pad for receiving a second potential voltage from outside of said device and supplying the second potential voltage;

a plurality of redundant fuse circuits each of which includes,         a redundant fuse having a first terminal and a second terminal, said redundant fuse being made of a material broken by an electric current flowing therethrough,         a detector circuit connected to one of the first and second terminals of said redundant fuse for outputting a detecting signal in response to a potential applied thereto from the one of the first and second terminals of said redundant fuse,         a selector circuit for selectively transferring input data to either a normally-used memory cell or a redundant memory cell in response to the detecting signal, and         a control circuit for supplying a third potential voltage to the other of first and second terminals of said redundant fuse in response to a redundancy cut enable signal;

a selection control circuit connected to said redundant fuse circuits for receiving the redundancy cut enable signal and redundancy data and selecting said redundancy fuse circuit in response to the redundancy data received thereto; and     a connection control circuit connected between the first and second pads, and said selection control circuit, said connection control circuit connecting the first and second pads to either said selection control circuit or a circuit used in a normal state in response to the redundancy cut enable signal, wherein the first and second potential voltage are applied to the first and second terminals of said redundant fuse of the selected redundant fuse circuit from the first and second pads through said connection control circuit and said selection control circuit, and wherein the redundancy cut enable signal is applied to said control circuit of the selected redundant fuse circuit through said selection control circuit.

9. A semiconductor memory device according to claim 8, wherein the second, third and first potential voltage are ground potential voltage, a power supply voltage and a high voltage being higher than the power supply voltage, respectively.

10. A semiconductor memory device according to claim 8, wherein said control circuit has a transistor including a first terminal connected to a third potential voltage source, a second terminal connected to the other of first and second terminals of said redundant fuse, and a control terminal coupled to receive the redundancy cut enable signal.

11. A semiconductor memory device according to claim 8, wherein said detector circuit has an inverter including an input terminal connected to the one of the first and second terminals of said redundant fuse and an output terminal outputting the detecting signal, and an transistor including a first terminal connected to the input terminal of the inverter, a second terminal connected to a second potential voltage source and a control terminal connected to the output terminal of the inverter.

12. A semiconductor memory device according to claim 8, wherein said connection control circuit has     a first transistor including a first terminal connected to said first pad, a second terminal connected to the circuit used in the normal state, and a control terminal coupled to receive the redundancy cut enable signal,     a second transistor including a first terminal connected to said second pad, a second terminal connected to the circuit used in the normal state, and a control terminal coupled to receive the redundancy cut enable signal,     a third transistor including a first terminal connected to said first pad, a second terminal connected to said selection control circuit, and a control terminal coupled to receive the redundancy cut enable signal,     a fourth transistor including a first terminal connected to said second pad, a second terminal connected to said selection control circuit, and a control terminal coupled to receive the redundancy cut enable signal.

13. A semiconductor memory device according to claim 12, wherein said first and second transistors have a first conductivity type and wherein said third and fourth transistors have a second conductivity type.

14. A semiconductor memory device according to claim 12, wherein said selection control circuit has     a plurality of registers each of which receives one bit of the redundancy data and outputs the received bit, and     a plurality of passing circuits each of which is connected to one of the registers, said connection control circuit, the control circuit of one of said redundant fuse circuits, and the first and second terminal of the redundant fuse of the one of said redundant fuse circuits, wherein said passing circuit supplies the redundancy cut enable signal to the control circuit of the one of said redundant fuse circuits and supplies the first and second potential voltage to the first and second terminal of the redundant fuse of the one of said redundant fuse circuits in response to the received bit thereto.

15. A semiconductor memory device, comprising:

a high voltage generating circuit generating a first potential voltage;

a second potential voltage source;

a plurality of redundant fuse circuits each of which includes, a redundant fuse having a first terminal and a second terminal, said redundant fuse being made of a material broken by an electric current flowing therethrough, a detector circuit connected to one of the first and second terminals of said redundant fuse for outputting a detecting signal in response to a potential applied thereto from the one of the first and second terminals of said redundant fuse, a selector circuit for selectively transferring input data to either a normally-used memory cell or a redundant memory cell in response to the detecting signal, and a control circuit for supplying a third potential voltage to the other of first and second terminals of said redundant fuse in response to a redundancy cut enable signal;

a selection control circuit connected to said redundant fuse circuits for receiving the redundancy cut enable signal and redundancy data and selecting said redundancy fuse circuit in response to the redundancy data received thereto; and a connection control circuit connected to said high voltage generating circuit, said second potential voltage source and said selection control circuit, said connection control circuit connecting said high voltage generating circuit and said second potential voltage source to either said selection control circuit or a circuit used in a normal state in response to the redundancy cut enable signal, wherein the first and second potential voltage are applied to the first and second terminals of said redundant fuse of the selected redundant fuse circuit from said high voltage generating circuit and said second potential voltage source through said connection control circuit and said selection control circuit, and wherein the redundancy cut enable signal is applied to said control circuit of the selected redundant fuse circuit through said selection control circuit.

16. A semiconductor memory device according to claim 15, wherein the second, third and first potential voltage are ground potential voltage, a power supply voltage and a high voltage being higher than the power supply voltage, respectively.

17. A semiconductor memory device according to claim 15, wherein said control circuit has a transistor including a first terminal connected to a third potential voltage source, a second terminal connected to the other of first and second terminals of said redundant fuse, and a control terminal coupled to receive the redundancy cut enable signal.

18. A semiconductor memory device according to claim 15, wherein said detector circuit has an inverter including an input terminal connected to the one of the first and second terminals of said redundant fuse and an output terminal outputting the detecting signal, and an transistor including a first terminal connected to the input terminal of the inverter, a second terminal connected to the second potential voltage source and a control terminal connected to the output terminal of the inverter.

19. A semiconductor memory device according to claim 15, wherein said connection control circuit has a first transistor including a first terminal connected to said high voltage generating circuit, a second terminal connected to the circuit used in the normal state, and a control terminal coupled to receive the redundancy cut enable signal, a second transistor including a first terminal connected to said second potential voltage source, a second terminal connected to the circuit used in the normal state, and a control terminal coupled to receive the redundancy cut enable signal, a third transistor including a first terminal connected to said high voltage generating circuit, a second terminal connected to said selection control circuit, and a control terminal coupled to receive the redundancy cut enable signal, a fourth transistor including a first terminal connected to said second potential voltage source, a second terminal connected to said selection control circuit, and a control terminal coupled to receive the redundancy cut enable signal.

20. A semiconductor memory device according to claim 19, wherein said first and second transistors have a first conductivity type and wherein said third and fourth transistors have a second conductivity type.

21. A semiconductor memory device according to claim 19, wherein said selection control circuit has a plurality of registers each of which receives one bit of the redundancy data and outputs the received bit, and a plurality of passing circuits each of which is connected to one of the registers, said connection control circuit, the control circuit of one of said redundant fuse circuits, and the first and second terminal of the redundant fuse of the one of said redundant fuse circuits, wherein said passing circuit supplies the redundancy cut enable signal to the control circuit of the one of said redundant fuse circuits and supplies the first and second potential voltage to the first and second terminal of the redundant fuse of the one of said redundant fuse circuits in response to the received bit thereto.

* * * * *